United States Patent
Manzardo

[19]

[11] Patent Number: 6,127,953
[45] Date of Patent: Oct. 3, 2000

[54] APPARATUS AND METHOD FOR COMPRESSING DATA CONTAINING REPETITIVE PATTERNS

[75] Inventor: Marcel Manzardo, Los Gatos, Calif.

[73] Assignee: Siemens Information and Communication Networks, Inc., Boca Raton, Fla.

[21] Appl. No.: 09/046,889

[22] Filed: Mar. 23, 1998

[51] Int. Cl.[7] .................................................. H03M 7/00
[52] U.S. Cl. .............................................................. 341/87
[58] Field of Search ................................. 341/87, 55, 51, 341/52, 63, 106

[56] References Cited

U.S. PATENT DOCUMENTS

| | | | |
|---|---|---|---|
| 3,571,807 | 3/1971 | Candy et al. | 340/172.5 |
| 4,054,951 | 10/1977 | Jackson et al. | 364/900 |
| 4,701,745 | 10/1987 | Waterworth | 340/347 DD |
| 5,227,893 | 7/1993 | Ett | 358/400 |
| 5,281,967 | 1/1994 | Jung | 341/55 |
| 5,455,577 | 10/1995 | Slivka et al. | 341/151 |
| 5,467,087 | 11/1995 | Chu | 341/151 |
| 5,521,597 | 5/1996 | Dimitri | 341/151 |

*Primary Examiner*—Brian Young

[57] ABSTRACT

A data compression/expansion method and apparatus are provided. The data compression apparatus (70) includes a repetitive symbol detector (72), a shift register (74), a FIFO (76), a byte counter (78), and a map buffer (80). The symbol detector (72) generates an output signal indicating the presence of repetitive symbols in an input data segment (10). The shift register (74) functions as a map generator, producing a map (16) for locating the repetitive symbols in the input segment (10). The FIFO (76) acts as a gate for removing the repetitive symbols from the input segment to produce a compressed output segment (14). The compressed segment (14) and map (16) can then be transmitted to the expansion apparatus (90). The data expansion apparatus (90) includes a buffer (92), a shift register (94), and a multiplexer (95). The buffer (92) temporarily stores the compressed segment (14). The shift register (74) and multiplexer (95) cooperate to decompress the output segment (14) by re-inserting the repetitive symbols according to the map (16). The compression/expansion apparatuses (70, 90) provide an efficient system for removing frequently occurring symbols from a communications channel.

19 Claims, 7 Drawing Sheets

APPARATUS AND METHOD FOR COMPRESSING DATA CONTAINING REPETITIVE PATTERNS

CROSS-REFERENCE TO RELATED CASE

This case is related to the following co-pending application, which is assigned to the same assignee: APPARATUS AND METHOD FOR INTERCONNECTING ISOCHRONOUS SYSTEMS OVER PACKET-SWITCHED NETWORKS, by Marcel Manzardo, Abid Farooq, and Steven Cole, Application Ser. No. 09/146,891, filed on Mar. 23, 1998. The subject of the above-identified application is incorporated herein by reference.

FIELD OF THE INVENTION

The present invention relates generally to data compression, and more particularly, to the removal of repetitive symbols in a digital data stream.

BACKGROUND OF THE INVENTION

Techniques have been developed to increase the amount of information that can be transmitted over communication networks. One conventional approach to increasing network capacity is to install additional network resources to increase overall bandwidth, such as additional routers and cabling. This approach, however, is relatively expensive. Another known approach is to introduce data compression into the network. Data compression typically provides increased data throughput without incurring large costs.

Data compression removes redundancy from a data stream, while preserving data that is essential for reconstructing the original stream at a later point in time. The transmission of compressed data requires not only less bandwidth, but also significantly less time. Therefore, an efficient data compression apparatus permits a communications service provider to expand network capacity at a substantial savings in cost.

A variety of data compression techniques are known. Conventional data compression techniques are classified either as statistical or dictionary-types of data compression. A statistical-type data compression is based on a single symbol coding. Single symbol coding is accomplished by assigning to each possible data symbol in an input data stream a probability for the appearance of that symbol. A symbol is typically represented by a digital value, such as a bit or byte. Examples of statistical data compression include Huffman encoding and the widely published variations of this technique. With Huffman encoding, a symbol having a greater probability of appearance is encoded with a short binary string, while a symbol having a lower probability of appearance in the input data stream is represented by a longer binary string. Although Huffman encoding provides high compression ratios, it requires relatively expensive and complex circuitry. One disadvantage of the statistical-type data compression is that it can require large amounts of memory to buffer the input data and a dictionary.

A dictionary-type data compression algorithm associates groups of consecutive data symbols to dictionary indices. The dictionary-type data compression methods are also commonly referred to as "code book" or "macro coding" approaches. The various code book schemes include the widely known Zif-Lempel (LZ) family of data compression techniques, which are all examples of dictionary-type data compression methods. A typical LZ-type compression method processes an input dat3 stream by checking first if each current input symbol encountered in the data stream matches a symbol already stored in an output buffer. If no match between the input symbol and a previously stored symbol is detected, the input symbol is stored in the output buffer. If, however, a match is detected between the current symbol and the stored data symbol, a pointer indicating a memory location storing a previously received symbol is stored into the buffer instead of the data stream. The LZ methods require a memory buffer for retaining some portion of the input data stream which will be used as a dictionary. In addition, the LZ method requires complex circuitry for generating pointers based on comparisons between stored data and subsequently received symbols.

U.S. Pat. No. 4,701,745 discloses a compression system that replaces a sequence of repetitive bytes in a data stream with an identification signal that indicates the location and length of a previous occurrence of the bytes in the data stream. However, this system also requires a memory buffer for temporarily storing the prior occurrence of the repetitive sequence.

The inclusion of additional memory buffers and circuitry to process input data increases the size, cost, and power dissipation of a compression system.

Another drawback of the above-described compression algorithms is that they typically require a processor for their execution. In a communications system using a central processor, these compression algorithms can consume precious computational resources and negatively affect the system's overall performance.

Therefore, there is a need for a data compression apparatus that does not strain limited computational resources and is simple to implement in digital circuitry without a large amount of memory and does not introduce additional delays.

SUMMARY OF THE INVENTION

It is an advantage of the present invention to provide a compression technique that is easily implemented in hardware without the use of a microprocessor or software. A complete hardware solution significantly reduces the processing time required to compress data. Another advantage of the present invention is that it provides a data compression technique that does not require a memory buffer for storing prior sequences of input data. A further advantage of the present invention is that it provides a compression technique that does not require a large dictionary of stored symbols.

The present invention provides a unique apparatus and method of compressing data. The compression apparatus includes a symbol detector, a map generator, and a gate. The symbol detector generates an output indicating the presence of the repetitive symbol in an input data segment. The map generator is configured to produce a digital map as a function of the symbol detector output. The digital map is used for locating occurrences of the repetitive symbol in the input data sequence. Also included in the apparatus is the gate, which produces a compressed data segment by removing all occurrences of the repetitive symbol from the input data segment based on based on the detector output. The apparatus can generate an output segment comprising the compressed data having appended to it the digital map.

According to the method, a plurality of flags are set based on a comparison between a sequence of input symbols and a predefined repetitive symbol. Each flag indicates whether a corresponding input symbol matches the repetitive symbol. Those symbols not matching the repetitive symbol are included in an output data segment. Appended to the output data segment is a digital map comprising the flags.

BRIEF DESCRIPTION OF THE DRAWINGS

The invention is pointed out with particularity in the appended claims. However, other features of the invention will become more apparent, and the invention will be best understood by referring to the following detailed description in conjunction with the accompanying drawings, in which:

DETAILED DESCRIPTION OF THE INVENTION

Figure 1:
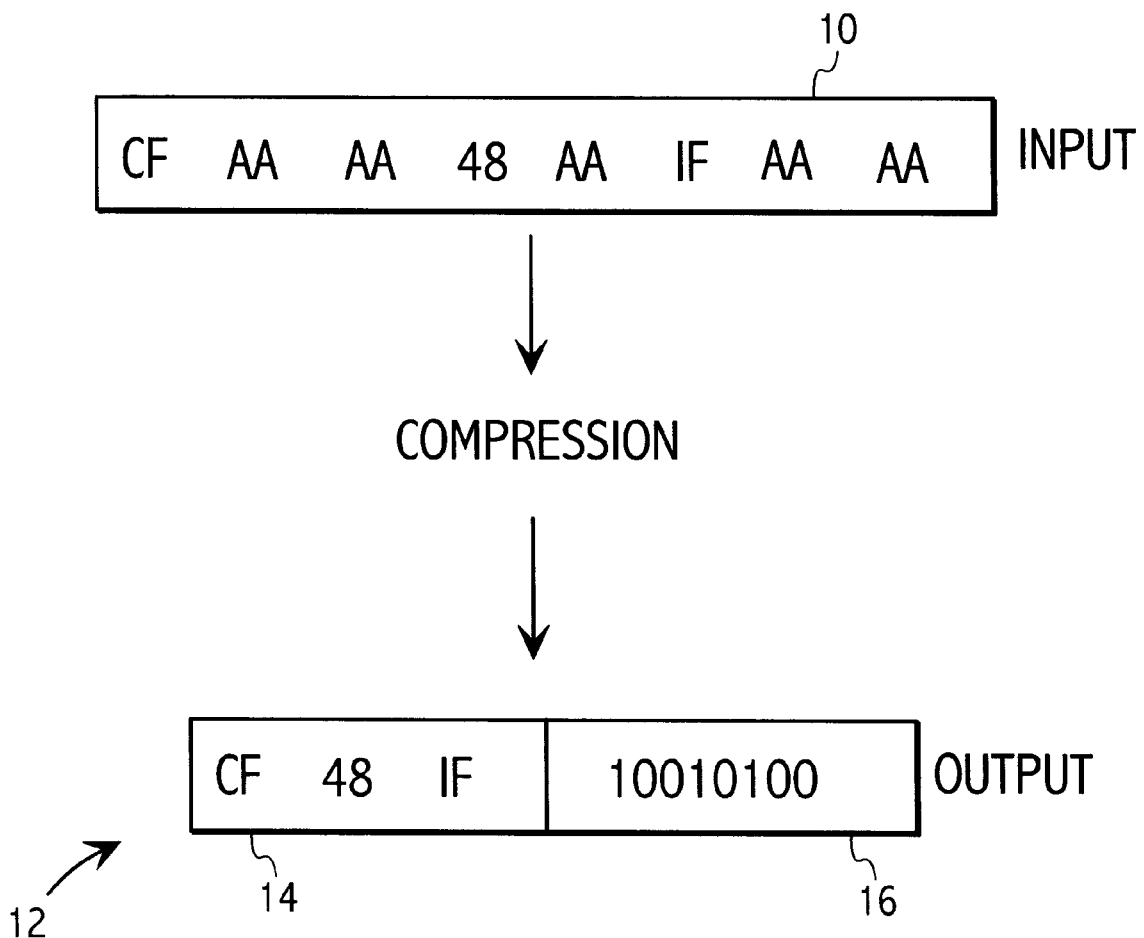
FIG. 1 illustrates an input data segment and the corresponding output segment resulting from the compression technique of the present invention.

Referring now to the drawings, and more particularly to FIG. 1, there is illustrated an exemplary input data segment 10 and a corresponding output segment 12 generated using the compression technique of the present invention. In the example shown, the input data segment 10 includes eight input symbols, CF, AA, AA, 48, M, IF, AA, and AA; while the output segment includes a compressed data segment 14 and a digital map 16. The symbols are depicted as digital bytes in hexadecimal format. One of ordinary skill in the art will realize that although the example shows symbols represented by 8-bit digital values, the scope of the invention includes any type or size of data symbol, as well as any length of data segments.

In the exemplary input data segment 10, the frequently occurring repetitive symbol is depicted by the value AA. The compression technique removes the repetitive symbol AA from the input data segment 10 to generate a compressed data segment 14. The compressed segment 14 includes all non-repetitive data symbols, indicated by the exemplary values CF, 48, 1F. In addition to the compressed segment, the compression technique of the present invention generates a digital map 16. The digital map 16 indicates which input symbols represent data and which are repetitive. In this example, the digital map includes a sequence of eight 1-bit values or one byte. Each value corresponds to a symbol included in the input data segment 10. The a logical "0" in the digital map 16 indicates that the corresponding input data symbol is a repetitive symbol, while a logical "1" indicates that the corresponding input symbol is a non-repetitive data symbol.

Compression is achieved only if the input data segment is larger than the output segment. Thus, for the compression technique to be effective in the example of FIG. 1, the input data segment must include more than 12.5% repetitive symbols. This is because the output segment includes an added byte for the digital map. Therefore, at least two of the eight data bytes in the input segment must be removed for there to be any compression.

The repetitive symbol percentage varies depending on the length of the symbols. For instance, in a system where symbols are 16-bits in length, an input data segment must include more than 6.25% repetitive symbols for the compression technique to be effective; while in a system with 4-bit symbols, the input segment must include more than 25% repetitive symbols.

The compression technique of the present invention is useful in communication systems that have frequently occurring, repetitive data symbols. Such systems include isochronous telecommunication systems that transmit large numbers of the time slots that are unused and carry idle symbols. The present invention provides a simple apparatus and method for eliminating these idle symbols from an isochronous data frame before it is transmitted across a telephony network. This, in turn, significantly increases the available bandwidth of the network.

Figure 2:
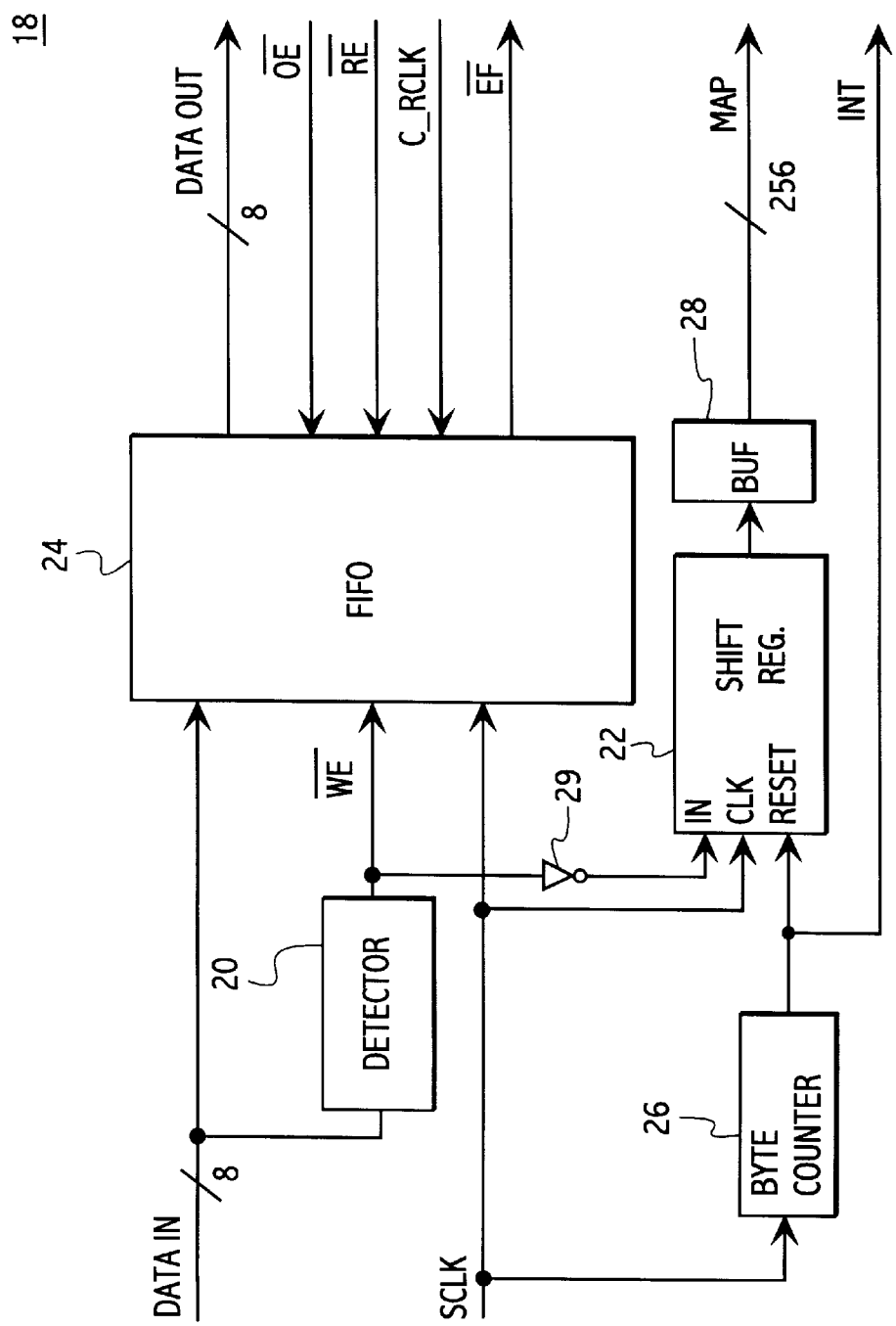
FIG. 2 illustrates a block diagram of a compression apparatus in accordance with one embodiment of the present invention.

FIG. 2 illustrates a block diagram of a compression apparatus 18 in conformity with an embodiment of the present invention. Apparatus 18 includes a detector 20, a shift register 22, a first-in-first-out (FIFO) buffer 24, a byte counter 26, and a map buffer 28. In this example, input data is provided to the detector 20 and FIFO 24 as 8-bit symbols, or bytes. The symbol clock (SCLK) is also provided to the FIFO 24 and the byte counter 26. Input data symbols are received synchronously with the SCLK signal. The detector 20 generates a detector output based on the input data stream. The detector 20 produces a 1-bit output that indicates whether an input symbol is equivalent to a predetermined repetitive symbol. The detector output is provided to the write enable (WE) input of the FIFO 24 and to the enable (EN) input of the shift register 22. When a repetitive symbol is detected, the detector 20 asserts a logical "1" output. Since the write enable is active low, this prevents a repetitive symbol from being stored in the FIFO 24. Thus, the FIFO 24 acts as a gate for removing the predefined repetitive symbol from the input data segment to produce a compressed data segment. The FIFO 24 includes address pointers that automatically keep track of symbol addresses within the buffer.

The detector output is inverted by an inverter 29 to produce an inverted output, which is then provided to the input (IN) of the shift register 22. The shift register 22 generates as output the digital map. This is accomplished by clocking the inverted detector output into the shift register 22 according to SCLK. When a data symbol is received on the data input, the logical "1" is presented to the shift register input. Conversely, when a repetitive symbol is received by the apparatus 18, a logical "0" is provided to the shift register input. The shift register shifts its input values until the end of an input data segment is reached. Shortly after reaching the end of an input segment and prior to being reset, the shift register contents are transferred to the buffer 28 for temporary storage.

The end of a data segment is indicated by the output of the byte counter 26. The byte counter 26 can include an incrementation circuit (not shown) that provides as output a digital value that is continuously incremented in response to SCLK signal. The output of the incrementation circuit is provided to a decoder (not shown). The decoder generates a single bit output lasting one cycle of SCLK when the incrementation reaches a predetermined digital value that represents the number of symbols in an input segment. The decoder output is provided to the reset input of the shift register 22. The incrementation circuit can be designed so that its output rolls over to zero upon reaching the predetermined value representing the length of the input segment. In addition, decoder output can be provided as an interrupt signal (INT) to an external system receiving the compressed data. The INT signal can be used to alert a downstream system that a compressed output segment is ready to be read.

In the example shown, input data segment is 256 bytes in length. Accordingly, the digital map is 256 bits in length. The digital map can be temporarily stored in buffer 28 until an external system reads the buffered value.

The compressed data segment is provided as output from the FIFO 24 as a sequence of bytes. The FIFO 24 can respond to signals from an external system. Externally received signals can include an output enable (OE), a read enable (RE), and a read clock (C_RCLK). In addition, the FIFO 24 can generate an empty FIFO (EF) signal indicating that the output data segment has been completely read from the FIFO 24.

Figure 3:
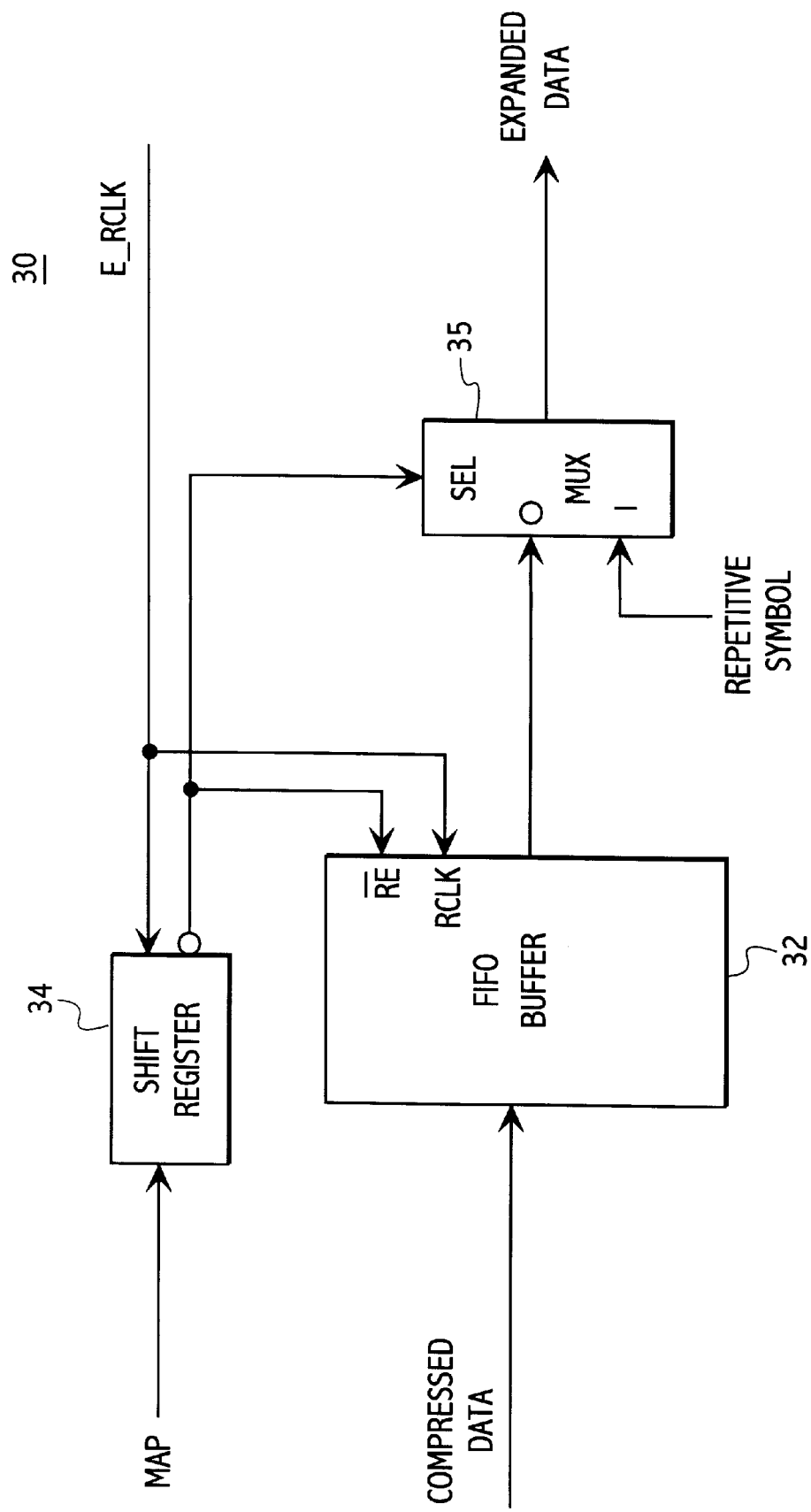
FIG. 3 illustrates a block diagram of a data expansion apparatus for de-compressing the compressed output data produced by the apparatus shown in FIG. 2.

FIG. 3 illustrates a block diagram of a data expansion apparatus 30 that can be used in conjunction with the compression apparatus of the present invention, such as the one shown in FIG. 2. The expansion apparatus 30 requires very few components, and is thus simple and inexpensive to implement using digital hardware. The expansion apparatus 30 includes a FIFO buffer 32, a shift register 34 and a multiplexer 35. The compressed data segment from the compression apparatus 18 is provided as input to the buffer 32. The compressed data includes only non-repetitive data symbols. The buffer temporarily stores these data symbols. The shift register 34 receives the digital map corresponding to the compressed segment. In the example shown, the shift register 94 includes inverted output.

In response to a read clock (E_RCLK), the shift register 34 sequentially provides each digit of the map to read enable (RE) input of the buffer 32 and the select (SEL) input of the multiplexer 35. When a logical "1" is shifted out of the shift register 34 indicating that the current symbol in the expanded data is a non-repetitive data symbol, the RE input is activated, permitting the data symbol to be read from the buffer 32. The FIFO buffer 32 includes address pointers that automatically keep track of the symbol addresses within the buffer. The data symbol read from the buffer 32 is provided as input to the multiplexer 35. The map value is inverted; thus, a logical "0" is provided to the select input of the multiplexer 35. Accordingly, the corresponding buffer output is provided as output of the multiplexer; thus, the non-repetitive data symbol is passed to the output of the expansion circuit. When the current digit of the map is a logical "0", the output of the buffer 32 is disabled, and the "1" input of the multiplexer 35 is selected. The repetitive symbol value is provided at the "1" input of the multiplexer 35. This value is passed through the multiplexer 35 as the expanded output.

The compression and the expansion apparatuses 18, 30 can be implemented using any form of digital hardware, such as discrete logic components, microprocessors, or application specific integrated circuits (ASICs). For example, in the compression apparatus 18, the detector 20, the byte counter 26, the shift register 22, and the buffer 28 can be implemented using combinatorial and sequential logic cells in an ASIC, while the FIFO 24 can be implemented using a dual port memory, such as Part No. CY7C419, manufactured by Cypress Semiconductor of San Jose, Calif. The shift register 34 and multiplexer 35 of the expansion apparatus 30 can be implemented using an ASIC having combinatorial and sequential logic cells, while the FIFO 32 can be implemented using the above identified dual port memory.

Figure 4:
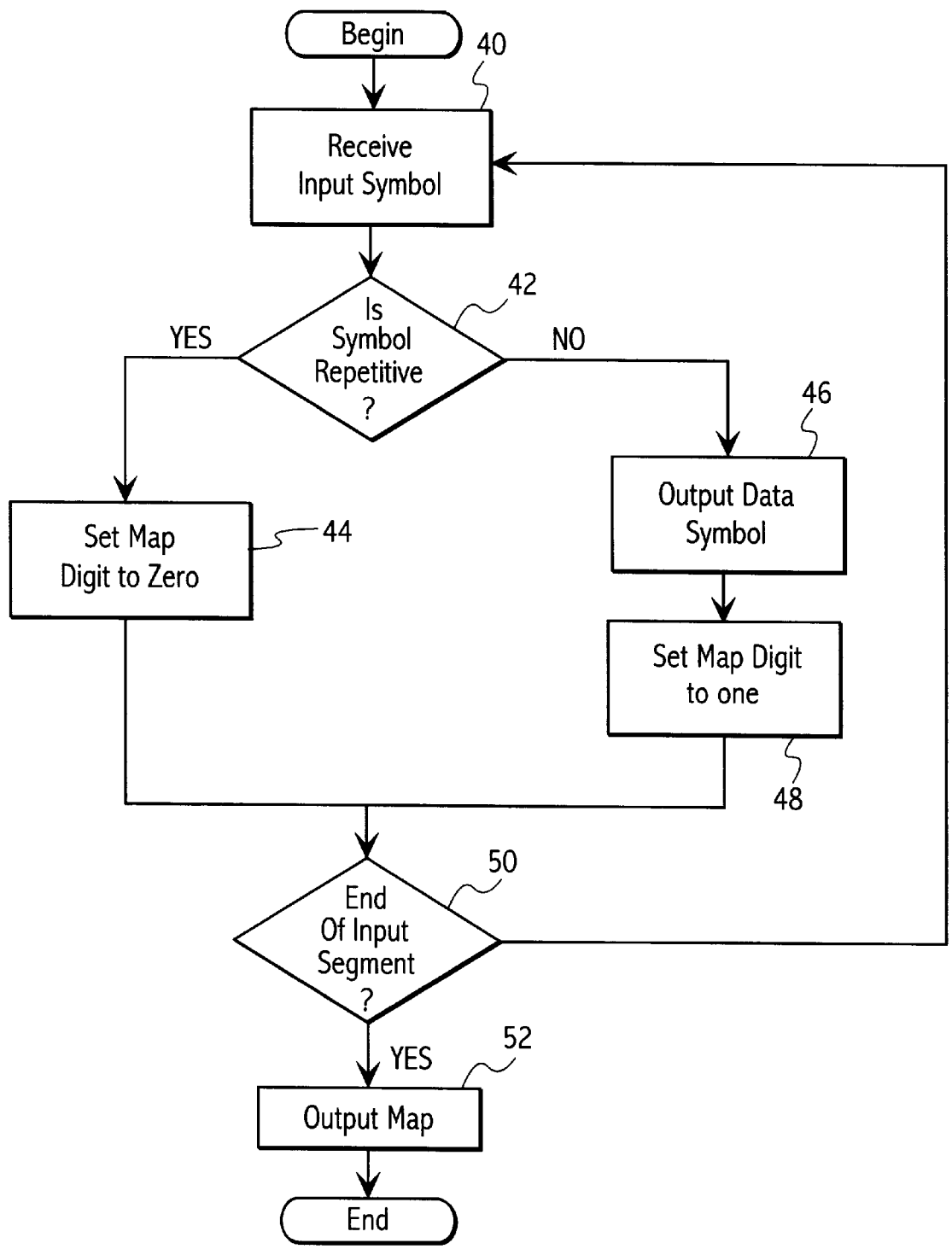
FIG. 4 illustrates a flow diagram of a method of generating an output segment in accordance with another embodiment of the invention.

FIG. 4 illustrates a flow diagram of a method of generating a compressed output, such as the output segment 12 shown in FIG. 1. For clarity, the following method descriptions in FIGS. 4–5 refer to the segments 10, 12 depicted in FIG. 1.

Referring now to FIG. 4, in step 40, the compression algorithm first receives an input symbol from the input data segment 10. The input data segment can represent a predetermined sequence of symbols included in a continuous data stream. Next, in step 42, a check is made to determine whether the input symbol is repetitive. If the input symbol is repetitive, the method proceeds to step 44, where a corresponding digit in the digital map is set to logical "0".

If the input is not repetitive, the method proceeds to step 46 where the input symbol, which represents non-repetitive data, is passed on as output. In step 48, the corresponding digit in the map is set to logical "1" to indicate that the symbol represents data rather than the repetitive symbol. In step 50, a check is made to determine whether the last symbol of the input data segment 10 has been reached. If so, the completed digital map 16 corresponding to the input segment 10 is generated as output (step 52). If not, the method returns to step 40 and repeats steps 42–50 for the next symbol in the input data segment 10.

Figure 5:
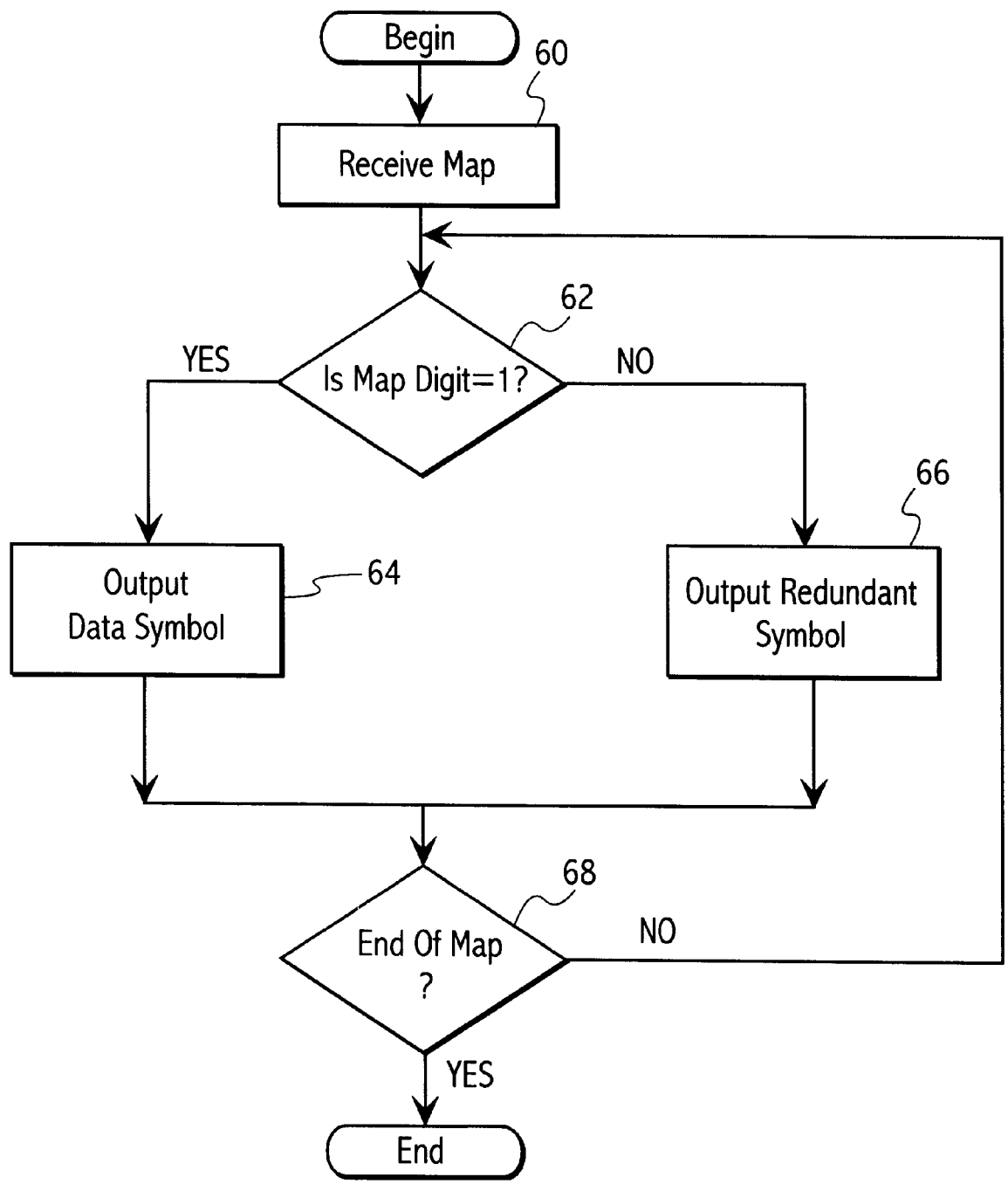
FIG. 5 illustrates a data flow diagram of a method for expanding the output segment generated by the method shown in FIG. 4.

FIG. 5 illustrates a flow diagram of a method for expanding the compressed data 14 included in the output data segment 12. Essentially, the compressed data segment 14 is expanded to the original input segment 10 by re-inserting the repetitive symbols according to the digital map 16. In step 60, the digital map 16 is received. In step 62, a check is made to determine whether the first digit of the map is a logical "1". If so, the current expanded output symbol is a non-repetitive data symbol contained in the compressed segment 14. The corresponding non-repetitive data symbol is generated as expanded output in step 64. If the map digit is a logical "0", the current expanded output is a repetitive symbol. Consequently, in step 66, a repetitive symbol is generated as the expanded output symbol. In step 68, a check is made to determine whether the end of the map 16 has been reached. If not, the method returns to step 62, and steps 62–68 are repeated for the next digit in the map; otherwise, the method terminates.

Figure 6:
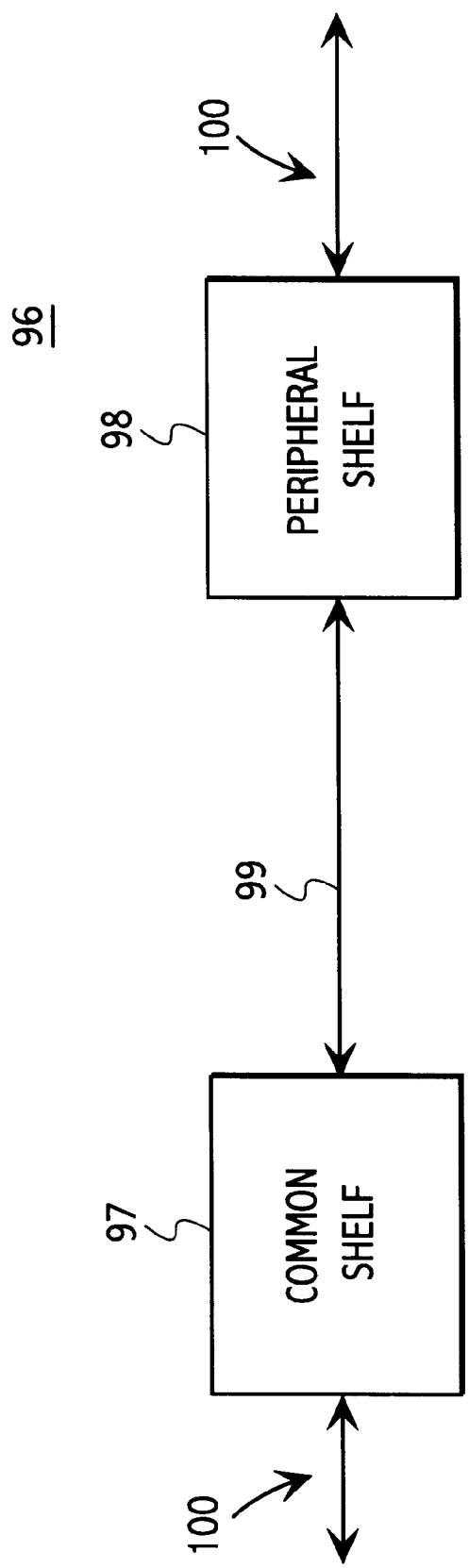
FIG. 6 illustrates a block diagram of a telecommunications system that can incorporate the compression apparatus of the present invention.

FIG. 6 illustrates a telecommunications system 96 that can incorporate an embodiment of the present invention. The telecommunication system 96 permits common and peripheral telecommunications shelves 97, 98 to be connected using a network 99. The common control shelf 97 can be any equipment used for transferring isochronous telecommunications data, such as a private branch exchange (PBX) or a computerized branch exchange (CBX). Although its functionality is not so limited, the common control shelf 97 can provide switching and call setup services to for calls placed to the peripheral shelf 98. The peripheral shelf 98 can be a PBX, CBX, or line trunk unit (LTU). Both shelves 97–98 are capable of transferring data over circuit-switched telephony networks 100. Typically, this data includes pulse code modulated (PCM) voice and high level data link layer control (HDLC) information. Although it is well known that the shelves 97–98 can be interconnected using a conventional isochronous circuit-switched network, the network 99 can also be a non-isochronous packet-switched network. A further description of a system for transferring isochronous telecommunications data over a packet-switched network is given in related application Ser. No. 09/046,891.

Figure 7:
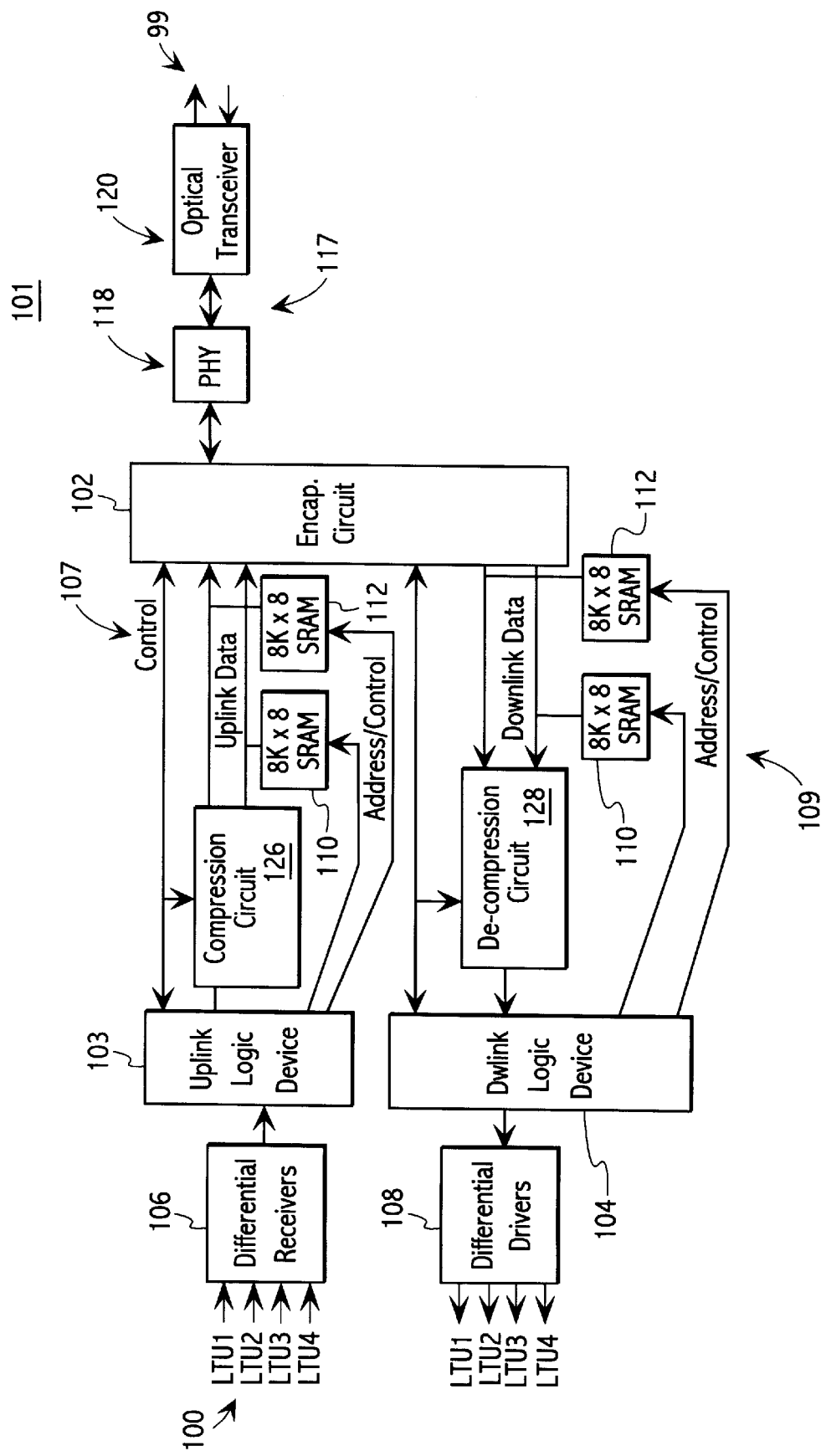
FIG. 7 illustrates a detailed block diagram of a controller that can be included in one of the shelves shown in FIG. 6.

FIG. 7 illustrates a detailed block diagram of a controller 101 that can be included in one of the shelves 97–98 of FIG. 6. The controller 101 permits the shelves 97–98 to transfer compressed isochronous data between one another using a packet-switched network. The controller 101 includes a packet logic device 102, an uplink logic device 103, a downlink logic device 104, an uplink buffer 107, a downlink buffer 109, a plurality of uplink differential receivers 106, a plurality of downlink differential drivers 108, a packet network interface 117 comprising pluralities of physical layer controllers 118 and optical transceivers 120, a compression circuit 126, and a de-compression circuit 128.

The controller 101 permits bi-directional communication, that is, it can simultaneous transfer two data streams—one moving from the circuit-switched network 100 toward the packet network 99 and another moving from the packet network 99 toward the circuit-switched network 100.

To transfer data moving toward the packet-switched network, the differential receivers 106 generate digital data in response to differential line inputs from the conventional telephony networks 100. The digital data can be a one or more serial bit streams. The uplink logic device 103 provides a multiplexing function and generates data bytes in response to the digital outputs of the differential receivers 106. From the uplink logic device 103, the data bytes are passed to the compression circuit 126. The compression circuit 126 can incorporate the compression apparatus 18 shown in FIG. 2. Essentially, the compression circuit 126 can remove idle time slots from the incoming isochronous frame according to the method of FIG. 4. The uplink logic device 103 controls the storage of the compressed bytes in the uplink buffer 107. The bytes are stored in a logical fashion that represents the compressed isochronous frames.

The packet logic device 102 reads the compressed isochronous frame data from the uplink buffer 107 and then packetizes this data into packet data frames for transfer over the packet network 99. To packetize the isochronous data, the packet logic device 102 adds the header and trailer information to each isochronous frame it reads from the uplink buffer 107. The packet logic device 102 then outputs packet frames to the physical layer controllers 118. The physical layer controllers 118 condition the packet data frames for transmission over the optical fiber link. The conditioned data frames are then transferred to the optical transceivers 120. The optical transceivers 120 convert the digital electronic; signals into optical signals that are transmitted over a fiber optic network.

To transfer data moving toward the circuit-switched network 100, the optical transceivers 120 first convert the optical signals into digital electronic signals, which are then passed to the physical layer controllers 118. The physical layer controllers 118 decode the electronic signals into data link layer information that represents packet data frames. The data link information is the transmitted to the packet logic device 100. Upon receiving the data link information, the packet logic device 100 strips away the header and trailer information to extract a compressed isochronous frame from the packet data frame. The compressed isochronous frame is then stored in the downlink buffer 109.

The downlink logic device 104 controls access to the compressed isochronous frame data stored in the buffer 109. In response to control signals from the downlink logic device 104, the compressed data is passed to the de-compression circuit 128. The decompression circuit 136 can include the expansion apparatus 30 shown in FIG. 3. The decompressed data is passed to the downlink logic device 104, which performs a de-multiplexing function to distribute decompressed isochronous data to the differential drivers 108. The downlink logic device 104 can output serial bit streams to each of the differential drivers 108.

The packet logic device 102 and the uplink and downlink logic devices 103–104 can be implemented using any form of digital hardware, such as one or more microprocessors, field programmable gate arrays (FPGAs), or application specific integrated circuits (ASICs). For example, the packet logic, uplink, and downlink logic devices 102–104 can be implemented using commonly available programmable logic devices, such as Part Nos.

EPF6016QC208-3 and EPF10K20RC208-3 from Altera Corporation. Some programmable devices, such as those available from Altera Corporation, can be configured on system power-up using a serial electronically programmable read only memory (EPROM).

Although any media can be used to implement the packet network, the example described herein utilizes a fiber optic packet-switched network. FIG. 7 shows an exemplary packet network interface 120 that permits a bi-directional optical link between the shelves 97–98.

The packet logic device 102 communicates with the physical layer controllers 118 using media independent interface (MII). The MII is a standard interface for Ethernet devices. The MII transports 100 Mbps of Ethernet data at 25 MHz over 4-bit wide transmit and receive data paths. Each of the four physical layer controllers 118 has an independent data interface to the packet logic device 102. Also, each physical layer controller 118 has an independent address, allowing the packet logic device 100 to select which physical layer controller is communicating at any given time.

The physical layer controllers 118 can implement standard Ethernet physical layer functions specified by IEEE 802.3 1 0BASE-T and 100BASE-FX Ethernet protocols. These functions include 4B/5B encoding/decoding and injecting, 4B/5B code group alignment, non return to zero inverted (NRZI) encoding/decoding, serial/parallel conversion, physical layer clock generation, and PECL interface to the optical transceivers 120. These functions can be provided by commonly available components, such as part No. DT83843 PHYTER from National Semiconductor Corporation of Santa Clara, Calif.

The optical transceivers 120 can provide either a multi-mode optical interface or a single mode interface for longer distances. The transceivers are designed for FDDI or Fast Ethernet applications. The data rate on the fiber can be 125 Mbaud. The optical transceivers and interface to the fiber optic cables are commonly available and can be implemented using standard components.

The differential receivers 106 and the differential drivers 108 can be connected to the control interfaces of either the common control or peripheral shelf 97–98. In the example shown, up to four separate LTU connections can be supported by a single controller. The signals at each connection are TTL-differential transmitted on twisted wire pairs. The differential receivers 106 can be implemented using standard components, such as Part No. 75ALS197 from Texas Instruments; while the differential drivers 108 can be implemented using standard components, such as Part No. 75ALS192 from Texas Instruments.

The uplink and downlink buffers 107,109 each consist of two independent fast static RAMs (SRAMs) 110,112. These buffers can be implemented using standard components, such as Part No. CY7C185-25 from Cyprus Semiconductor Corporation. The buffers operate in a ping-pong manner, that is, each SRAM is alternatively accessed by either the uplink/downlink logic devices or the packet logic device 100. Consequently, one of the SRAMs can be accessed by the uplink/downlink logic device while the other SRAM can be simultaneously accessed by the packet logic device 102. To the packet logic device 102, the uplink/downlink buffers can function as first-in-first-out (FIFO) buffers. Alternatively, the uplink and downlink buffers 107,109 can be implemented using a dual port memory instead of two separate SRAMs.

While specific embodiments of the present invention have been shown and described, it will be apparent to those skilled in the art that the disclosed invention may be modified in numerous ways and may assume many embodiments other than the preferred form specifically set out and described above. Accordingly, it is intended by the appended claims to cover all modifications of the invention which fall within the true spirit and scope of the invention.

What is claimed is:

1. An apparatus, comprising:

means for detecting, in an input data stream, a predefined repetitive bit pattern;

means for generating a map for defining the sequential locations of the predefined repetitive bit pattern and other bit patterns in the input data stream;

means for removing the predefined repetitive bit pattern from the input data stream defining a compressed data stream; and means for concatenating the map to the compressed data stream.

2. The apparatus of claim 1, further comprising:

means for detecting an input data segment of predetermined size comprising the predefined repetitive bit pattern.

3. The apparatus of claim 1, wherein the input data stream represents a plurality of time slots from an isochronous telecommunications network.

4. The apparatus of claim 1, further comprising:

means for transmitting the compressed data stream and the map over a telecommunications network.

5. The apparatus of claim 1, further comprising:

means for transmitting the compressed data stream and the map over a packet-switched network.

6. The apparatus of claim 1, further comprising:

means for expanding the compressed data stream to represent the input data stream by inserting the predefined repetitive bit pattern into the compressed data stream as a function of the map.

7. In a telecommunications system, an apparatus for compressing data, comprising:

a segment detector configured to identify a data segment included in a continuous stream of input data from an isochronous network;

an idle symbol detector for generating a symbol detector output indicating the presence of an idle symbol in the data segment;

a map generator configured to produce a digital map as a function of the symbol detector output, the digital map for locating at least one occurrence of an idle symbol in the data segment; and a gate capable of producing a compressed data segment by removing the at least one occurrence of the idle symbol from the data segment in response to the symbol detector output.

8. The apparatus of claim 7, wherein the isochronous network is a circuit-switched network.

9. The apparatus of claim 7, further comprising:

an encapsulation circuit capable of encapsulating the compressed data segment and the map into a data frame that is transferrable over a non-isochronous network.

10. The apparatus of claim 9, wherein the non-isochronous network is a packet-switched network.

11. The apparatus of claim 7, further comprising:

a multiplexer configured to generate a data segment in response to a plurality of isochronous telecommunications input signals.

12. The apparatus of claim 7, wherein the data segment represents a plurality of time slots.

13. In a telecommunications system, an apparatus for transferring compressed data, comprising:

a symbol detector for generating a symbol detector output indicating the presence of a predefined symbol among a plurality of symbols included in a input data segment from a first circuit-switched network;

a map generator producing a map having a plurality of flags corresponding to the symbols in the data segment, the map generator setting the flags according to the symbol detector output; and a gate capable of removing the predefined symbol from the input data segment to produce a compressed data segment;

an encapsulation circuit capable of encapsulating the compressed data segment and the map into a data packet;

a de-encapsulation circuit capable of extracting the compressed data segment and the map from the data packet;

a de-compression circuit capable of inserting the predefined symbol into the compressed data segment according to the map to generate a decompressed data segment; and an output interface for transmitting the de-compressed data segment over a second circuit-switched network.

14. The apparatus of claim 13, further comprising: a packet-switched network, in communication with the encapsulation and de-encapsulation circuits, for transferring the data packet.

15. The apparatus of claim 14, wherein the packet-switched network includes a fiber optic cable.

16. The apparatus of claim 13, further comprising:

a segment detector configured to identify the input data segment in response to a continuous stream of input data.

17. In a telecommunications system, a method of compressing data, comprising the following steps:

predefining a repetitive symbol;

receiving a data segment comprising a sequence of input symbols;

setting a plurality of flags based on a comparison between the input symbols and the repetitive symbol, each of the flags indicating whether a corresponding input symbol matches the repetitive symbol;

outputting only those input symbols not matching the repetitive symbol; and outputting the plurality of flags.

18. The method of claim 17, further including the following steps:

multiplexing a plurality of isochronous signals to produce the data segment.

19. The method of claim 17, further including the following step:

encapsulating the flags and at least one non-matching input symbol into a data packet that is transferrable over a non-isochronous network.

* * * * *